United States Patent [19]

Hasegawa et al.

[11] Patent Number: 5,274,283
[45] Date of Patent: Dec. 28, 1993

[54] COMPOUND SEMICONDUCTOR INTEGRATED CIRCUIT DEVICE

[75] Inventors: Yoshimichi Hasegawa; Gaku Ishii, both of Yokohama, Japan

[73] Assignee: Sumitomo Electric Industries, Ltd., Japan

[21] Appl. No.: 726,183

[22] Filed: Jul. 5, 1991

[30] Foreign Application Priority Data

Jul. 13, 1990 [JP] Japan .................................. 2-185958

[51] Int. Cl.$^5$ .................... H03K 19/094; H01L 25/00
[52] U.S. Cl. .................. 307/468; 307/303.2; 257/390
[58] Field of Search ............... 307/303.1, 303.2, 482.1, 307/465, 465.1, 468, 450; 357/42, 45, 45 M, 23.12, 22

[56] References Cited

U.S. PATENT DOCUMENTS

| | | | |
|---|---|---|---|
| 4,651,190 | 3/1987 | Suzuki et al. | 357/45 |
| 4,716,308 | 12/1987 | Matsuo et al. | 307/303.2 |
| 4,745,307 | 5/1988 | Kitamura et al. | 307/468 |
| 4,771,327 | 9/1988 | Usui | 357/45 |
| 4,791,474 | 12/1988 | Sugiura et al. | 357/45 |

OTHER PUBLICATIONS

Patent Abstracts of Japan, vol. 7, No. 52, Mar. 2, 1983 & JP-A-57 202 772 (Nippon Denki K.K.) Nov. 12, 1992.

W. H. Davenport, "Macro evaluation of a GaAs 3000 Gate Array", IEEE GaAs IC Symposium, Technical Digest 1986, Grenelefe, Fla., Oct. 28-30th, 1986, pp. 19-21.

H. Tanaka et al., "GaAs E/D BEL Logic Circuit Technology for ECL compatible 1.6k Gate Array", Proceedings of the IEEE International Conference on Computer Design: VLSI In Computer, Port Chester, N.Y., Oct. 7th-10th, 1985, pp. 789-792.

Primary Examiner—Edward P. Westin
Assistant Examiner—Andrew Sanders
Attorney, Agent, or Firm—Beveridge, DeGrandi, Weilacher & Young

[57] ABSTRACT

A gate array includes a plurality of basic cells which each include normally-on type transistors and a plurality of normally-off type transistors. The source electrode, drain electrode and gate electrode of each normally-off type transistor are not connected in common to the electrodes of the other transistors in the cell. Thus, a desired number of normally-off type transistors can be connected to a particular normally-on type transistor by wiring. Thus, unnecessary connections of normally-off type transistors to a normally-on type transistor can be avoided.

14 Claims, 4 Drawing Sheets

COMPOUND SEMICONDUCTOR INTEGRATED CIRCUIT DEVICE

BACKGROUND OF THE INVENTION

Field of the Invention

The present invention relates to a gate array and compound semiconductor integrated circuit device featured by a layout of electrodes of a transistor.

Related Background Art

A compound semiconductor integrated circuit device which forms an inverter circuit by combining a plurality of transistors has been known. One example is shown in "a 1K-gate GaAs gate array", 1984 IEEE International Solid-State Circuits Conference, P41. It discloses a gate array having an electrode pattern shown in FIG. 1A. The electrode array shows a layout for one cell of the gate array. An equivalent circuit diagram of the device is shown in FIG. 1B. One normally-on type transistor (D-FET) 1 and three normally-off type transistors (E-FET) 2-4 are arranged in array. The D-FET 1 and the E-FET 2 are connected in series, and the E-FET 3 and the E-FET 4 are connected in series. By interconnecting mid-points of both series circuits by wiring 5 in the basic cell, a three-input E/D inverter is formed. Input electrodes IN1-IN3 are respectively connected to gate electrodes of the E-FET 2-4, and an output electrode OUT is connected in common to drain electrodes of the E-FET 2-4. Another example is shown in "A High electron Mobility Transistor 1.5K Gate Array", 1986 IEEE International Solid-State Circuits Conference, P80. It discloses a gate array having an electrode pattern shown in FIG. 2. The electrode pattern also shows a layout for one cell of the gate array, and an equivalent circuit thereof is similar to that shown in FIG. 3B. One D-FET and three E-FET's form a DCFL E/D inverter circuit.

In the compound semiconductor integrated circuit device having the above prior art layout, the three-input inverter circuit can be formed, but in order to add one more input to form a four-input inverter circuit, an E-FET of an adjacent cell must be used. In this case, because of the above arrangement, two E-FET series circuits are used so that a five-input inverter circuit is formed. Namely, an unnecessary E-FET is borrowed from the adjacent cell, and this makes a usage efficiency lower.

SUMMARY OF THE INVENTION

It is an object of the present invention to provide a gate array and a compound semiconductor integrated circuit device which do not cause waste in increasing the number of inputs of an inverter circuit.

In order to a achieve the above object, in the gate array and the semiconductor compound integrated circuit device of the present invention, each electrode of the E-FET in the basic cell is not common to other E-FET's but independent from them. Thus, as many E-FET's and D-FET's as desired may be connected by wiring without connecting unnecessary E-FET to the D-FET.

The present invention will become more fully understood from the detailed description given hereinbelow and the accompanying drawings which are given by way of illustration only, and thus are not to be considered as limiting the present invention.

Further applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1A:
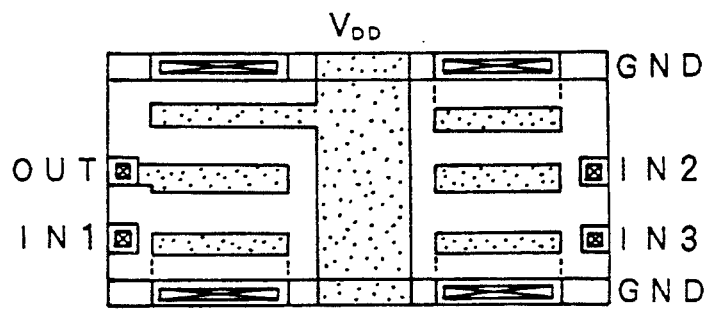
FIGS. 1A and 1B show a configuration of a basic cell of a prior art gate array and an equivalent circuit therefore.
Figure 1B:
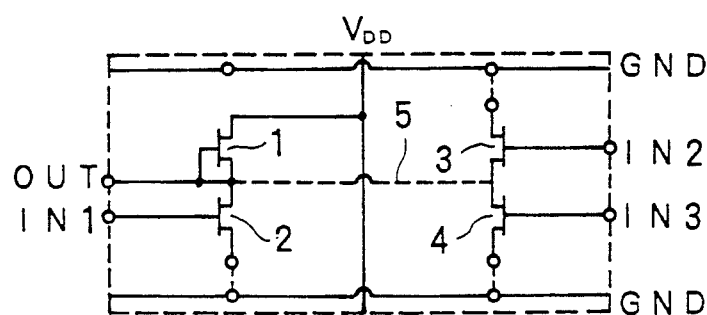
Figure 2:
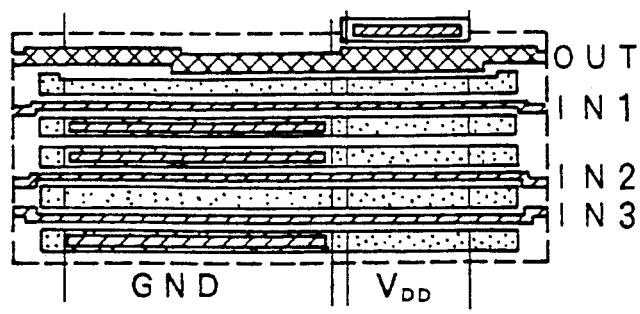
FIG. 2 shows a configuration of a basic cell of another prior art gate array.
Figure 3:
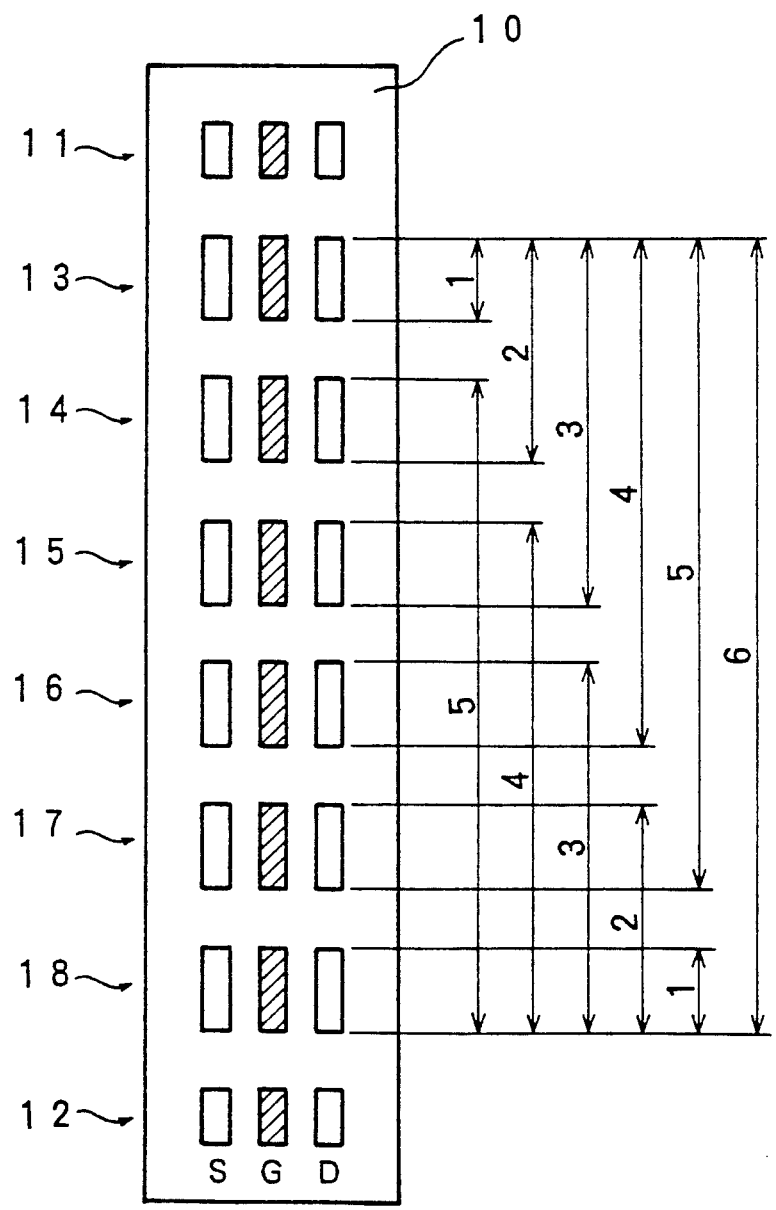
FIG. 3 shows a plan view of a configuration of a basic cell of a gate array in accordance with one embodiment of the present invention.

FIG. 3 shows a plan view of an electrode pattern of a gate array in accordance with one embodiment of the present invention. It shows an electrode pattern of one basic cell.

Two normally-on type MESFET's and six normally-off type MESFET's are formed in an a line and arranged in array on a GaAs semiconductor substrate 10. A D-FET 11 and a D-FET 12 are normally-on type FET's which produce drain currents $I_D$ without gate bias. E-FET's 13-18 are normally-off type FET's which do not produce the drain current $I_D$ when the gate bias is not applied. Each of the FET's 11-18 has an independent drain electrode D, gate electrode G and source electrode S, and the electrodes D, G, and S are arranged in line.

There are various ways to configure a DCFL E/D inverter circuit with such an electrode pattern. In one cell, each of the E-FET's 13-18 can be connected to either one of the D-FET's 11 and 12. Accordingly, there are six possible combinations as shown. In one combination, the D-FET 11 and the E-FET 13 are connected, the D-FET 12 and the E-FET's 14-18 are connected, an inverter formed by the D-FET 11 and E-FET 13 is provided with one input, and another inverter formed by the D-FET 12 and E-FET's 14-18 is provided with five inputs. In another combination, the D-FET 11 and the E-FET's 13 and 14 are connected, an inverter formed by the D-FET 12 and E-FET's 13 and 14 is provided with two inputs, and another inverter formed by the D-FET 12 and E-FET's 15-18 is provided with four inputs. In a similar manner, there are four other combinations and any number of inputs may be provided in inverters respectively formed by the D-DET's 11 and 12, respectively.

Figure 4A:
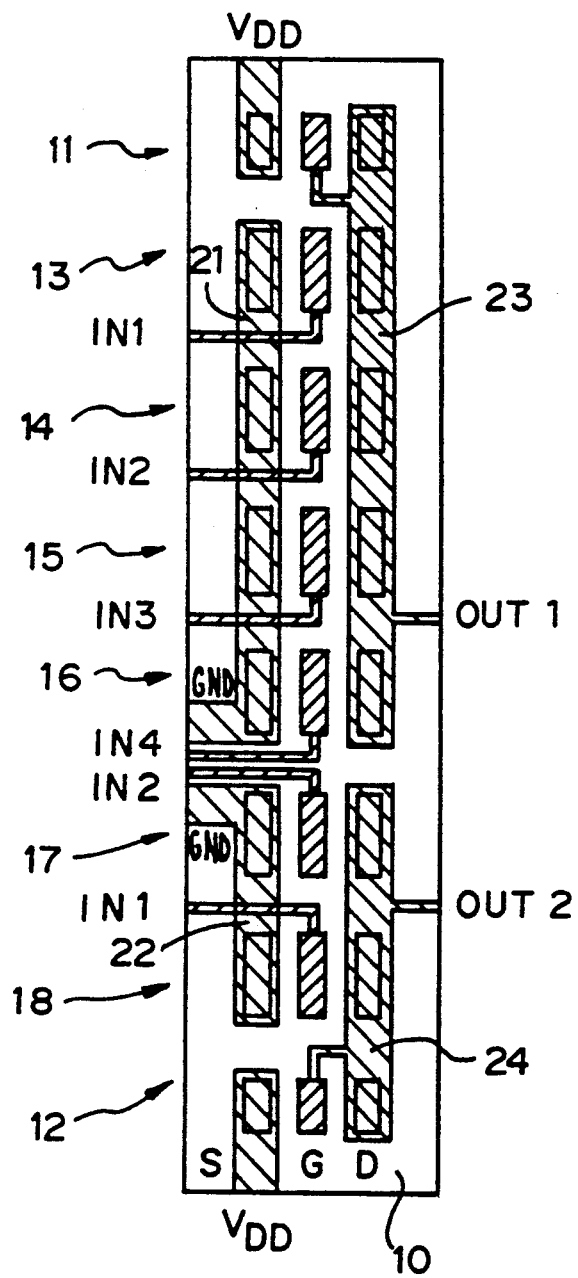
FIGS. 4A and 4B show a wiring connection of electrodes in the device shown in FIG. 3 and an equivalent circuit thereof.
Figure 4B:
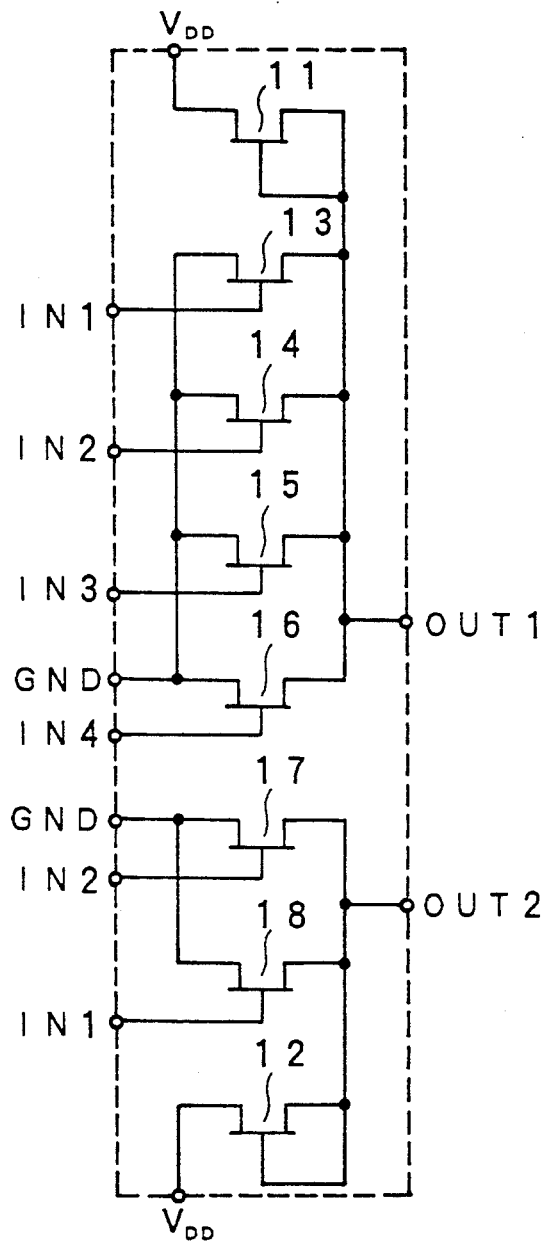

A combination in which four inputs are provided in an inverter formed by D-FET 11 and two inputs are provided in another inverter including the D-FET 12 is explained with reference to FIG. 4. FIG. 4A shows a plan view of an electrode pattern, and FIG. 4B shows an equivalent circuit for the device shown in FIG. 4A. The like elements to those shown in FIG. 3 are designated by the like numerals and the explanation thereof is omitted.

The source electrodes S of the E-FET's 13–16 and the source electrodes S of the E-FET's 17 and 18 are connected in common by wiring patterns 21 and 22, respectively, and they are connected to a ground potential GND. The drain electrode D of the E-FET's 13–16 and the drain electrode D of the E-FET's 17 and 18 and the drain electrode D of the D-FET 12 are connected in common by wiring patterns 23 and 24, respectively, and they are connected to an output OUT1 and an output OUT2, respectively.

The gate electrodes G of the normally-on type D-FET's 11 and 12 are connected to wiring patterns 23 and 24, respectively, and the source electrodes S thereof are connected to a power supply voltage $V_{DD}$. The gate electrodes G of the normally-off type E-FET's 13–16 form inputs IN1–IN4 of the inverter circuit formed by the D-FET 11. Similarly, the gate electrodes G of the normally-off type E-FET's 17 and 18 form inputs IN1 and IN2 of an inverter circuit formed by the D-FET 12.

Four inverter circuits, that is, an E/D inverter circuit by the D-FET 11 and the E-FET 13, an E/D inverter circuit by the D-FET 11 and E-FET 14, and E/D inverter circuit by the D-FET 11 and the E-FET 15, and an E/D inverter circuit by the D-FET 11 and the E-FET 16 are formed by the D-FET 11. Similarly, two E/D inverter circuits are formed by the D-FET 12.

In accordance with the present embodiment, since the two D-FET's 11 and 12 and the six E-FET's 13–18 are arranged in line, the six E-FET's 13–18 can be combined with the two D-FET's 11 and 12 in any desired manner and one input can be provided for each E-FET. The E-FET's 13–18 can be combined with either one of the D-FET's 11 and 12 and any number of inputs between 1 and 6 per cell can be selected. The remaining E-FET's may be combined with the other D-FET 11 or 12 without waste so that the usage efficiency of the FET's is improved.

Since the electrodes are arranged in line, the pattern of the outputs OUT1 and OUT2 depends only on the connection of adjacent drain electrodes D. Accordingly, patterning of the wiring patterns 23 and 24 can be readingly effected.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A gate array having an array of basic cells each including a plurality of normally-on type transistors and a plurality of normally-off type transistors, at least one of said cells comprising
   normally-on type transistors which each have a gate electrode and a drain electrode thereof electrically connected together; and
   normally-off type transistors with drain electrodes which are not electrically connected in common but are independent, whereby certain of said normally-off type transistors of said at least one cell are connectable to one of said normally-on type transistors thereof by wiring by electronically connecting said drain electrodes of said certain normally-off type transistors to said electrically connected gate electrode and drain electrode of at least one of said normally-on type transistors of said at least one cell.

2. A gate array according to claim 1 wherein said basic cell includes a plurality of normally-off type transistors arranged in a column direction and normally-on type transistors arranged at the opposite ends of said column of said plural normally-off type transistors.

3. A gate array according to claim 2 wherein said basic cell includes six normally-off type transistors and two normally-on type transistors.

4. A compound semiconductor integrated circuit device comprising:
   a gate array having an array of basic cells, each cell including a plurality of normally-on type transistors and a plurality of normally-off type transistors on a compound semiconductor substrate, and wiring,
   characterized in that
   said normally-on type transistors each have a gate electrode and a drain electrode electrically connected together, and
   said normally-off type transistors have drain electrodes which are not connected in common but are independent whereby certain of said plurality of normally-off type transistors are connectable to one of said normally-on type transistors by wiring by electrically connecting said drain electrodes of said certain normally-off type transistors to said electrically connected drain electrode and gate electrode of at least one of said normally-on type transistors.

5. A compound semiconductor integrated circuit device according to claim 4, wherein said basic cell includes a plurality of normally-off type transistors arranged in a column direction and normally-on type transistors arranged at the opposite ends of said column of said plural normally-on type transistors.

6. A compound semiconductor integrated circuit device according to claim 5 wherein said basic cell includes six normally-off type transistors and two normally-on type transistors.

7. A compound semiconductor integrated circuit device according to claim 6 wherein the normally-off type transistors are connected in series to the normally-on type transistors to form an inverter.

8. A gate array having an array of basic cells, each cell comprising
   a plurality of normally-off type transistors and a normally-on type transistor having a gate electrode and a drain electrode electrically connected together,
   drain electrodes of said plurality of normally-off type transistors not being connected in common but being independent whereby certain of said plurality of normally-off type transistors are electrically connectable to said normally-on type transistor by wiring by electronically connecting said drain electrodes of said certain normally-off type transistors to said electrically connected gate electrode and drain electrode of said normally-on type transistor.

9. A compound semiconductor integrated circuit device comprising:
   a gate array having an array of basic cells, at least one of said cells including a plurality of normally-off type transistors and a normally-on type transistor which has a gate electrode a and drain electrode electrically connected together on a compound semiconductor substrate, and wiring,
   electrodes of said plurality of normally-off type transistors not being connected in common but being independent whereby certain of said normally-off type transistors of said at least one cell are connectable to said normally-on type transistor by wiring by electronically connecting said drain electrodes of said certain normally-off type transistors to said electrically connected gate electrode and drain electrode of said normally-on type transistor.

10. A basic cell for a gate array, said basic cell comprising:
at least one normally-on type transistor having a gate electrode and a drain electrode electrically connected together, and
a plurality of normally-off type transistors,
electrodes of said plurality of normally-off type transistors not being connected in common but being independent whereby certain of said plurality of normally-off type transistors are connectable to said at least one normally-on type transistor by wiring by electronically connecting said drain electrodes of said certain normally-off type transistors to said electrically connected gate electrode and drain electrode of said normally-on type transistor.

11. A basic cell as claimed in claim 10, wherein said transistors are MESFETs.

12. A basic cell as claimed in claim 10, wherein said cell comprises a plurality of normally-on type transistors.

13. A basic cell as claimed in claim 12, wherein said normally-off type transistors are arranged to form a column and said normally-on transistors are provided at opposite ends of said column.

14. A basic cell as claimed in claim 13, wherein said column comprises six normally-off type transistors and two normally-on type transistors.

* * * * *